(12) United States Patent
Kuan et al.

(10) Patent No.: US 8,465,675 B2
(45) Date of Patent: Jun. 18, 2013

(54) ENCAPSULATION MATERIAL

(75) Inventors: Min-Tsung Kuan, Taichung County (TW); Ming-Chia Li, Taichung County (TW); Wen-Hsien Wang, Tainan County (TW); Kuo-Chan Chiou, Tainan (TW); Tzong-Ming Lee, Hsinchu (TW); Fang-Yao Yeh, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 247 days.

(21) Appl. No.: 12/979,158

(22) Filed: Dec. 27, 2010

(65) Prior Publication Data

US 2011/0253942 A1 Oct. 20, 2011

(30) Foreign Application Priority Data

Apr. 14, 2010 (TW) .............................. 99111556 A

(51) Int. Cl.
| | |
|---|---|
| *H01L 31/048* | (2006.01) |
| *C09K 3/10* | (2006.01) |
| *C08F 218/08* | (2006.01) |
| *C08F 210/00* | (2006.01) |
| *C08K 5/14* | (2006.01) |
| *C08G 63/08* | (2006.01) |

(52) U.S. Cl.
USPC ................. 252/301.16; 252/301.35; 524/219; 136/257; 136/247

(58) Field of Classification Search
USPC .. 252/301.16, 301.35; 136/247, 257; 524/219
See application file for complete search history.

(56) References Cited

U.S. PATENT DOCUMENTS

| 5,447,576 A | 9/1995 | Willis |
| 6,093,757 A | 7/2000 | Pern |
| 6,369,316 B1 | 4/2002 | Plessing et al. |
| 7,368,655 B2 | 5/2008 | Blieske et al. |

FOREIGN PATENT DOCUMENTS

| CA | 2251715 | 10/1997 |
| CN | 101369608 A | 2/2009 |
| EP | 1541136 A1 | 6/2005 |
| JP | 2000-183382 | 6/2000 |
| JP | 2001-007377 | 1/2001 |
| JP | 2006-179626 | 7/2006 |
| TW | 200847458 | 12/2008 |
| WO | WO 2006/093936 A2 | 9/2006 |

OTHER PUBLICATIONS

Brenda C. Rowan, et al., "Advanced Material Concepts for Luminescent Solar Concentrators," Journal of Selected Topics in Quantum Electronics, Sep. 2008, vol. 14, No. 5, P. 1312-1322, IEEE, US.

*Primary Examiner* — Carol M Koslow

(57) ABSTRACT

Disclosed are encapsulation materials including an 80 to 99.5 weight percentage (wt %) of ethylene vinyl acetate copolymers (EVA) and a 0.5 to 20 weight percentage(wt %) of a photoluminescent polymer, wherein the EVA and the photoluminescent polymers are evenly blended. The encapsulation materials can be applied to packaging solar cells, and the encapsulating structure may protect the EVA from UV damage and enhance light utilization efficiency of the solar cell.

14 Claims, 3 Drawing Sheets

ENCAPSULATION MATERIAL

CROSS REFERENCE TO RELATED APPLICATIONS

This Application claims priority of Taiwan Patent Application No. 99111556, filed on Apr. 14, 2010, the entirety of which is incorporated by reference herein.

BACKGROUND OF THE INVENTION

1. Field of the Invention

The invention relates to encapsulation materials, and in particular relates to solar cell encapsulating modules utilizing the same.

2. Description of the Related Art

The first solar cell was manufactured by Bell Labs, U.S.A., in 1954, and it was applied to provide electricity for remote communication systems. However, the solar cell is lacked commercial value due to low light conversion efficiency (only about 6%) and high cost (375 U.S. dollars per watt). Many improvements have been made by those skilled in art over the years, but the problems such as low conversion efficiency, high cost, and short operating life time continue to plague designers.

Encapsulating modules can be utilized to protect solar cells from air and moisture, to reduce chips in the solar cells from being damaged, and to enhance applicability of the solar cells. The encapsulating modules should have excellent anti-UV properties, thermal degradation resistance, and fast curable properties to meet market requirements for applications.

In 1970, ethylene vinyl acetate (EVA) copolymer resin and a polyvinylbutyral (PVB) were selected as the material for encapsulating modules by NASA Labs, U.S.A. Because the EVA resin has advantages such as low cost and high transparency, it has been widely used to encapsulating the solar cells. However, EVA resin has poor UV resistance and poor thermal resistance; and degrades quickly, so that after a period of usage, protection of the solar cells diminishes. In U.S. Pat. No. 6,093,757, WO06/093936, JP 2000183382, U.S. Pat. No. 7,368,655, EA0001908, and U.S. Pat. No. 5,447,576, additives such as UV absorbers, thermal stabilizers, and/or resin accelerators are added to the EVA resin. The UV absorbers may increase the UV resistance of the EVA resin, the thermal stabilizers may improve the thermal degradation resistance of the EVA resin, and the resin accelerators such as peroxide may quickly cure the EVA resin without generating a photo acid. Although the additives can solve problems which the encapsulation materials encounter when utilizing the EVA resin, the light conversion efficiency of the solar cells is not further increased by the additives.

In JP 2001007377, a fluorescent dye is coated on the outside of the glass substrate to converse UV radiation to a visible light. The method not only reduces the influence of the UV radiation on the encapsulation material, but also enhances light conversion efficiency. However, the method is complex and does not enhance the thermal resistance of the inner encapsulation material. Accordingly, the outermost fluorescent dye layer requires protection by an additional encapsulation material, which increases process steps and related costs.

An encapsulation material having a long operating life time and the ability to converse UV radiation to visible light to improve solar cell efficiency thereof is called for.

BRIEF SUMMARY OF THE INVENTION

The invention provides an encapsulation material, comprising: an 80 to 99.5 weight percentage (wt %) of an ethylene vinyl acetate copolymer (EVA); and a 0.5 to 20 weight percentage (wt %) of a photoluminescent polymer, wherein the EVA and the photoluminescent polymer are evenly blended, and the photoluminescent polymer has the general formula as follows:

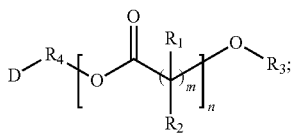

wherein D is a photoluminescent group; $R_1$, $R_2$, $R_3$ are independently selected from hydrogen, a substituted $C_{1-6}$ alkyl group, or an unsubstituted $C_{1-6}$ alkyl group; $R_4$ is a substituted $C_{1-6}$ alkylenyl group or an unsaturated $C_{1-6}$ alkylenyl group; m is an integer of 1 to 5; and n is 10 to 10,000.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
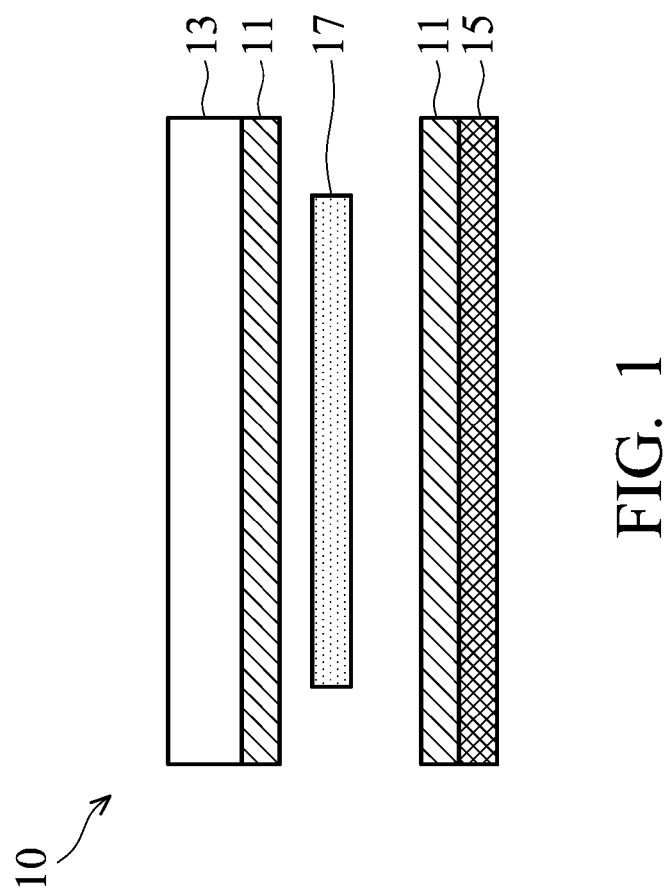
FIG. 1 is a schematic view showing a solar cell encapsulating module in one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

One embodiment of the invention provides an encapsulation material including an 80 to 99.5 weight percentage (wt %) of an ethylene vinyl acetate copolymer (EVA) and a 0.5 to 20 weight percentage (wt %) of a photoluminescent polymer. If the EVA has an overly high weight percentage (equal to the photoluminescent polymer having an overly low weight percentage), the EVA cannot efficiently converse incident UV radiation to a visible light. If the EVA has an overly low weight percentage (equal to the photoluminescent polymer having an overly high weight percentage), the cost of the encapsulation material will increase, while improvement in light conversion efficiency of UV radiation to visible light would not be largely increased. In one embodiment, the EVA copolymer has a number average molecular weight (Mn) of 5,000 to 100,000, wherein the ethylene monomer and the vinyl acetate monomer in the EVA copolymer have a molar ratio of 60:40 to 80:20, or preferably of 65:35 to 75:25. An ethylene monomer having an overly high molar ratio will reduce transparency and the adherence of the EVA. A vinyl acetate monomer having an overly high molar ratio will increase water adsorption of the EVA. A photoluminescent polymer is evenly blended in the EVA copolymer without aggregation or migration to the surface of the blend. For achieving an evenly blended effect, the photoluminescent polymer has the general formula as shown in Formula 1.

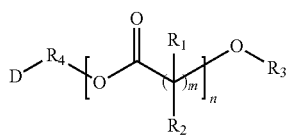

(Formula 1)

In Formula 1: D is a photoluminescent group; $R_1$, $R_2$, $R_3$ are independently selected from hydrogen, a substituted $C_{1-6}$ alkyl group, or an unsubstituted $C_{1-6}$ alkyl group; $R_4$ is a substituted $C_{1-6}$ alkylenyl group or an unsaturated $C_{1-6}$ alkylenyl group; m is an integer of 1 to 5; and n is 10 to 10,000. The photoluminescent group D can be a pyrenyl group, an anthracenyl group, a naphthalenyl group, a flavonyl group, a coumarinyl group, a perylenyl group, a carbazole group, other photoluminescent groups, derivatives thereof, or combinations thereof. The photoluminescent group D may absorb UV radiation with a wavelength less than 400 nm, and emit a visible light (e.g. fluorescence or phosphorescence) with a wavelength greater than 400 nm. When the encapsulation material is exposed to an ambient light, it may reduce UV radiation damage to the EVA as well as increase light conversion efficiency of the solar cell.

In Formula 1, the photoluminescent polymer terminal is the photoluminescent group D, and the photoluminescent polymer backbone is a polylactone. The photoluminescent polymers can be formed by ring-opening polymerization, and suitable monomers include a caprolactone, a valerolactone, a butyrolactone, a propionolactone, a lactic acid, or an acetolactone. In Formula 1, the "m" is determined by carbon numbers of the monomers, and the $R_1$ and $R_2$ are determined by the substituents of the monomers. The catalyst of the ring-opening polymerization can be tin(II) 2-ethylhexanoate (Sn$(Oct)_2$). The molecular weight of the photoluminescent polymer, e.g. polymerization degree "n" in Formula 1, is determined by the weight ratio of the catalyst and the lactones. In one embodiment, the photoluminescent polymer has a number average molecular weight (Mn) of 5,000 to 100,000. It is difficult for a photoluminescent polymer having an overly high or overly low Mn to be evenly blended with the EVA. The refractive index of the photoluminescent polymer is preferably 1.2 to 1.7 to make the encapsulation material have high transparency and low haze. The melting point of the photoluminescent polymer is preferably ranging between 50° C. and 130° C. for easier processing of the encapsulation material.

Although the photoluminescent polymer blended in the described encapsulation material may reduce UV radiation damage to the EVA, the UV radiation cannot be entirely conversed to visible light. To extend the operating life time of the encapsulation material and improve efficiency of the encapsulating process, 0.1 wt % to 5 wt % of additives (e.g. a resin accelerator, a thermal stabilizer, or combinations thereof) can be added to the encapsulation material. In general, the resin accelerator can be benzoyl peroxide (BPO), dicummyl peroxide, 2,5-dimethyl-2,5-di(tert-butylperoxy) hexane, 1,1-di(tert-butylperoxy)-3,3,5-trimethylcyclohexane, or combinations thereof. The resin accelerator generates radical under heat to crosslink with the EVA, such that the original thermoplastic encapsulation material will transfer to be thermosetted after encapsulating the solar cell. As such, the encapsulation material after the encapsulating laminating process would not be changed by heat, and would efficiently protect the encapsulating module device such as the solar cell from air or moisture damage. Meanwhile, the described thermal stabilizer such as a butylhydroxytoluene, a bis(2,2,6,6-tetramethyl-4-piperidyl)sebacate, or combinations thereof may stabilize radicals or photo acids from breaking bonds of the EVA under heat or UV radiation. Accordingly, the thermal stabilizer may prevent radicals or photo acids from damaging the solar cell devices.

In one embodiment, the described blended encapsulation material 11 is formed on the substrates 13 and 15, respectively. Afterward, the solar cell 17 is charged between the encapsulation material 11 on the substrates 13 and 15, and then thermally compressed to form a solar cell encapsulating module 10 as shown in FIG. 1. The substrate can be made of transparent material such as glass, plastic, or resin. The substrate 15 can be made of reflective material such as metal. The solar cell 17 can be a silicon based solar cell chip.

Compared with the conventional encapsulation material EVA, the blend including photoluminescent polymer in the invention may converse UV radiation to visible light. As such, the light utilization efficiency of the solar cell is enhanced. Furthermore, the phenomenon of EVA damage due to UV radiation is mitigated, to extend the operating life time of devices. Note that the photoluminescent group is grafted to the terminal of the polylactone which can be evenly blended with the EVA. In the invention, small photoluminescent molecules directly blended with the EVA is not preferred. According to the results of experiments, polymers such as polystyrene cannot be evenly blended with EVA, and an uneven blend will increase its haze and decrease transparency. Moreover, if small photoluminescent molecules are used, they would only disperse in the EVA resin rather than being dissolved in the EVA resin. If small photoluminescent molecules are directly blended with the EVA, the small photoluminescent molecules would easily aggregate or migrate to the blend surface. Accordingly, the encapsulation material composed of EVA and small photoluminescent molecules would be degraded, which shortens the operating life time of devices.

EXAMPLES

Example 1

80 wt %, 90 wt %, 98 wt %, and 99 wt % of EVA (D150 having 32% vinyl acetate, commercially available from Dupont) were blended with 20 wt %, 10 wt %, 2 wt %, and 1 wt % of polycaprolactone (prepared from Preparation Example 1B) in toluene (commercially available from tedia, 99%), respectively. The blended solutions were spin-coated on glass plates to form films, respectively. The haze and the transparency of the films were tabulated and are shown in Table 1. As shown in Table 1, even if the amount of the polycaprolactone in the film is increased to 10 wt %, the film still showed high transparency and low haze. Accordingly, the polycaprolactone was efficiently dispersed in the EVA copolymer.

TABLE 1

|  | Example 1a | Example 1b | Example 1c | Example 1d |
|---|---|---|---|---|
| EVA weight percentage | 99 | 98 | 90 | 80 |
| PCL weight percentage | 1 | 2 | 10 | 20 |
| Transparency (%) | 91.29 | 91.81 | 91.74 | 91.14 |
| Haze (%) | 1.28 | 0.82 | 0.86 | 0.36 |

Comparative Example 1

90 wt %, 98 wt %, and 99 wt % of EVA (D150, commercially available from Dupont) were blended with 10 wt %, 2 wt %, and 1 wt % of polystyrene (MW=250,000, commercially available from Acros), respectively. The blends were spin-coated on glass plates to form films, respectively. The haze and the transparency of the films were tabulated and are shown in Table 2. As shown in Table 2, when the amount of the polystyrene in the film was increased to 10 wt %, the haze of the film was significantly increased indicating that the polystyrene was not able to be well dispersed in the EVA copolymer.

As shown in comparison between Example 1 and Comparative Example 1, not all polymers blended in a similar manner as the polylactone could well dispersed in the EVA copolymer. Therefore, polylactone was selected to be the backbones of photoluminescent polymers in the following examples, and photoluminescent groups were grafted to the polylactone backbones.

TABLE 2

|  | Comparative Example 1a | Comparative Example 1b | Comparative Example 1c |
|---|---|---|---|
| EVA weight percentage | 99 | 98 | 90 |
| PS weight percentage | 1 | 2 | 10 |
| Transparency (%) | 91.27 | 91.02 | 91.55 |
| Haze (%) | 2.5 | 2.82 | 9.5 |

Figure 2:
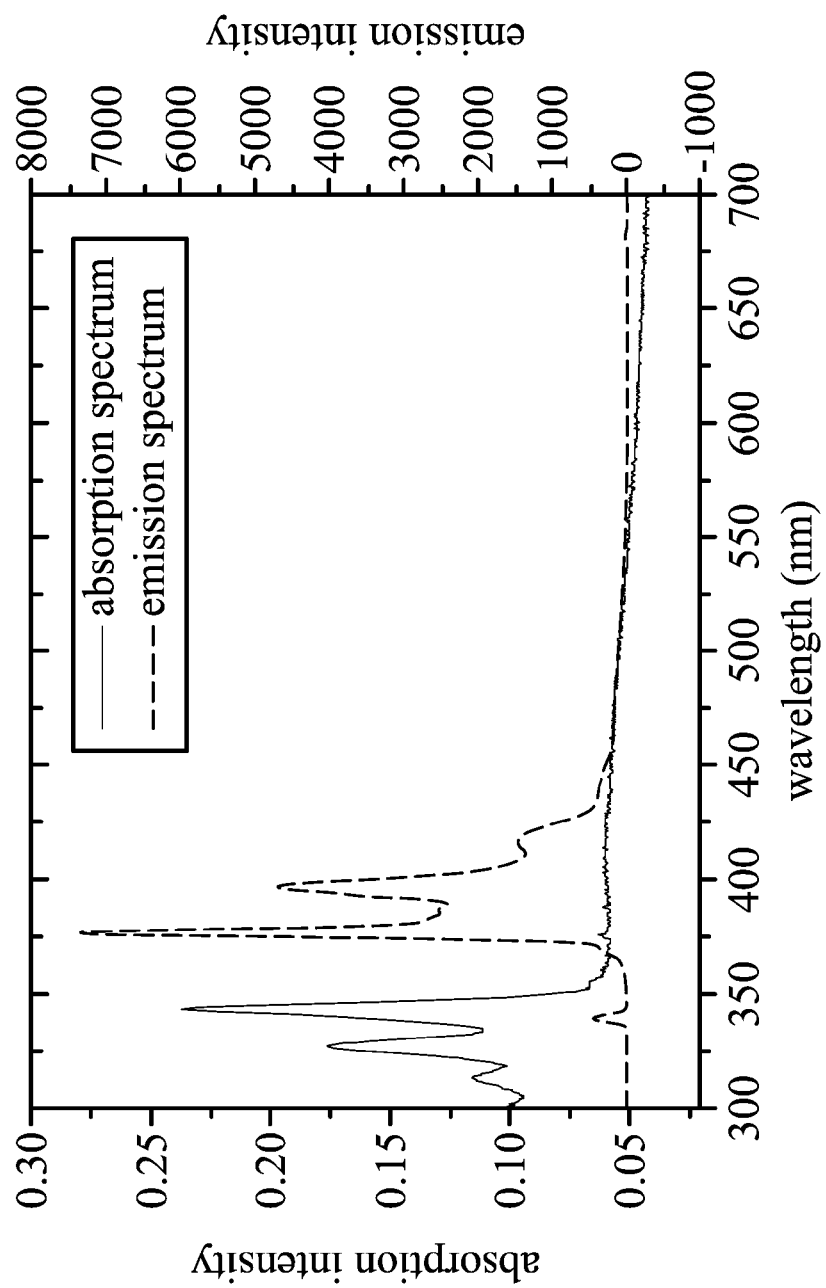
FIG. 2 shows an excitation and emission spectra of a photoluminescent polymer having a terminal pyrenyl group.

Preparation Example 1A 0.09 g of 1-pyrenebutanol (commercially available from Aldrich), 18 g of caprolactone (commercially available from TCI, 98%), and 0.1 g of tin(II) 2-ethylhexanoate (commercially available from Aldrich) were dissolved in 20 mL of toluene (commercially available from tedia, 99%). The solution was heated to 130° C. for ring-opening polymerization for 8 hours as shown in Formula 2, and 7 g of photoluminescent polymer (yield=70%) was obtained. The photoluminescent polymer had a number-average molecular weight of 8139 (measured by GPC), a melting point ranging between 55° C. and 60° C., and a refractive index ranging between 1.48 and 1.52. The absorption spectrum and fluorescence spectrum of the photoluminescent polymer film are shown in FIG. 2, wherein the fluorescence spectrum using the excitation light source at 340 nm.

(Formula 2)

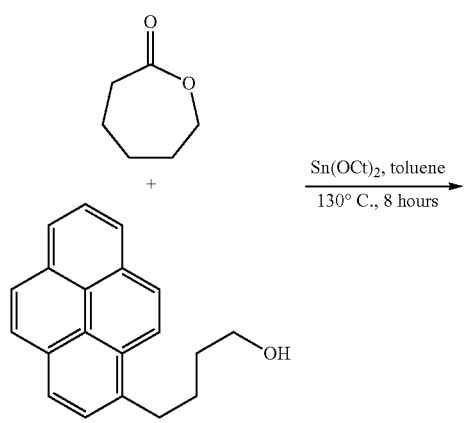

Preparation Example 1B 0.035 g of benzyl alcohol (commercially available from Aldrich), 18 g of caprolactone (commercially available from TCI, 98%) and 0.1 g of tin(II) 2-ethylhexanoate (commercially available from Aldrich) were dissolved in 20 mL of toluene. The solution was heated for ring-opening polymerization for 8 hours, and 15 g of polycaprolactone (yield=83%) was obtained. The polycaprolactone had a number-average molecular weight of 8500 (measured by GPC) and a melting point ranging between 55° C. and 60° C.

Preparation Example 2

Figure 3:
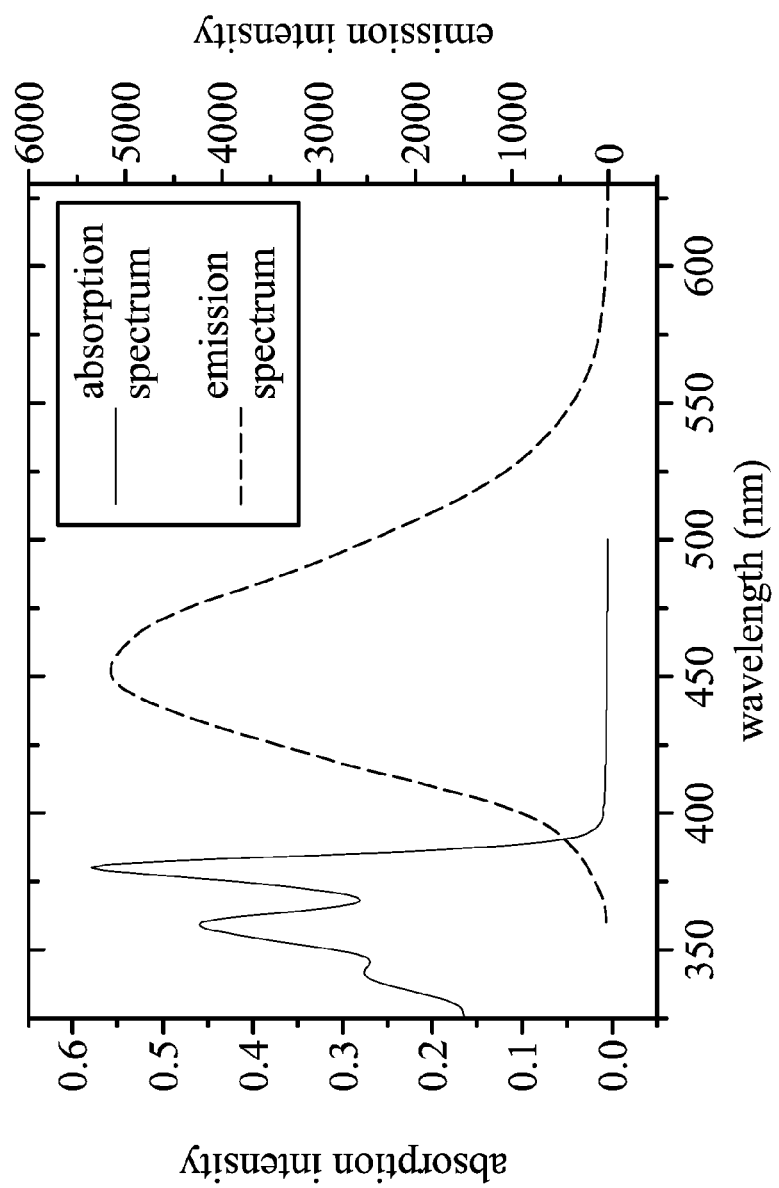
FIG. 3 shows an excitation and emission spectra of a photoluminescent polymer having a terminal naphthalenyl group.

0.1 g of naphthalenyl derivative (compound B in Formula 3), 10 g of caprolactone, and 0.1 g of tin(II) 2-ethylhexanoate were dissolved in 20 mL of toluene. The solution was heated to 130° C. for ring-opening polymerization for 8 hours as shown in Formula 3, and 6.5 g of photoluminescent polymer (yield=65%) was obtained. The photoluminescent polymer had a number-average molecular weight of 7140 (measured by GPC), a melting point ranging between 55° C. and 60° C., and a refractive index ranging between 1.48 and 1.51. An absorption spectrum and a fluorescence emission spectrum of the photoluminescent polymer film are shown in FIG. 3, wherein the fluorescence spectrum using the excitation light source at 340 nm.

(Formula 3)

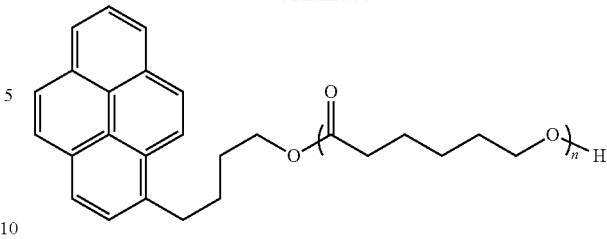

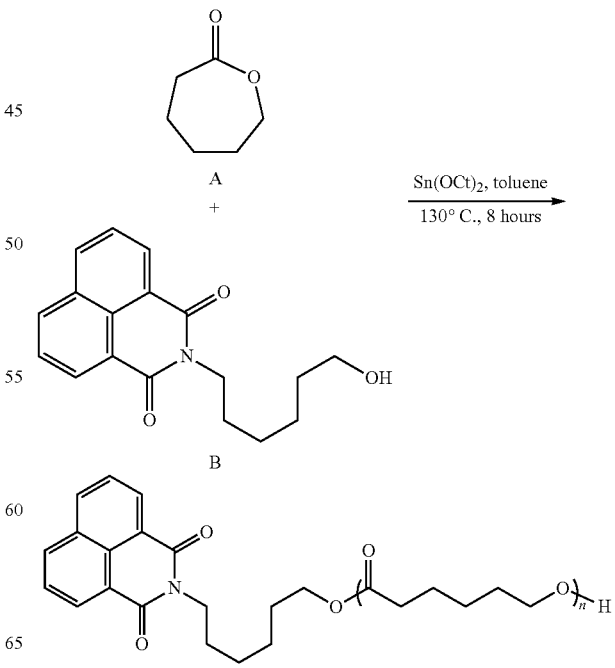

Preparation Example 3

0.07 g of 9H-Carbazole-9-ethanol(commercially available from Aldrich), 18 g of caprolactone, and 0.1 g of tin(II) 2-ethylhexanoate were dissolved in 20 mL of toluene. The solution was heated to 130° C. for ring-opening polymerization for 8 hours as shown in Formula 4, and 10 g of photoluminescent polymer was obtained. The photoluminescent polymer had a number-average molecular weight of 8140 (measured by GPC), a melting point ranging between 55° C. and 60° C., and a refractive index between 1.48 and 1.51.

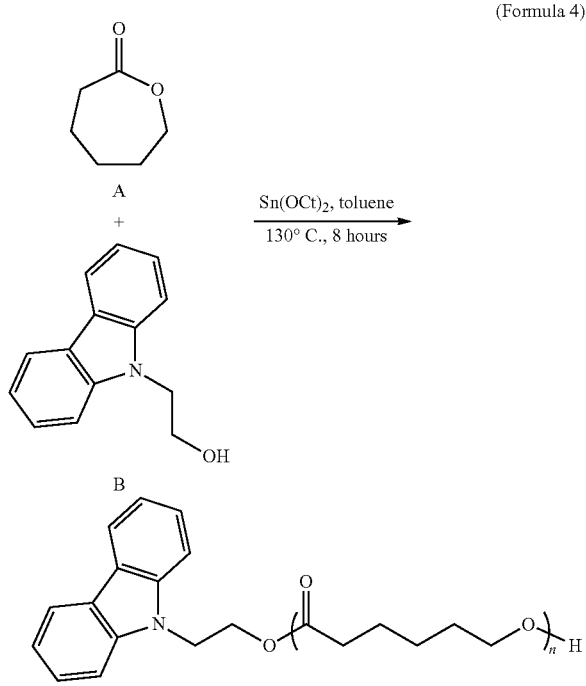

(Formula 4)

Example 2

According to Table 3, 90 wt %, 98 wt %, and 99 wt % of EVA (D150) were blended with 10 wt %, 2 wt %, and 1 wt % of the products in Formula 2 prepared from Preparation Examples 1A in toluene, respectively. According to Table 4, 90 wt %, 98 wt %, and 99 wt % of EVA (D150) were blended with 10 wt %, 2 wt %, and 1 wt % of the products in Formula 4 prepared from Preparation Examples 3 in toluene, respectively. The blended solutions were spin-coated on glass plates to form films, respectively. The haze and the transparency of the films were tabulated and are shown in Tables 3 and 4. As shown in Tables 3 and 4, even if the amount of the products in Formulae 2 and 4 in the film were increased to 10 wt %, the films still had high transparency and low haze. Therefore, both products in Formulae 2 and 4 were well dispersed in the EVA copolymer.

TABLE 3

| | Example 2a | Example 2b | Example 2c |
|---|---|---|---|
| EVA weight percentage | 99 | 98 | 90 |
| Product in Formula 2 weight percentage | 1 | 2 | 10 |
| Transparency (%) | 91.34 | 91.71 | 91.63 |
| Haze (%) | 0.81 | 0.81 | 0.51 |

TABLE 4

| | Example 2d | Example 2e | Example 2f |
|---|---|---|---|
| EVA weight percentage | 99 | 98 | 90 |
| Product in Formula 4 weight percentage | 1 | 2 | 10 |
| Transparency (%) | 91.71 | 91.68 | 91.60 |
| Haze (%) | 0.84 | 0.95 | 1.59 |

Comparative Example 2

90 wt % of EVA (D150) was blended with 10 wt % of the 3-hydroxyflavone (commercially available from Aldrich). The blend was spin-coated on a glass plate to form a film. The haze and transparency of the film were tabulated and are shown in Table 5. As shown in the comparison between the Example 2c (Table 3) and Comparative Example 2 (Table 5), even if the amount of the 3-hydroxyflavone was equal to the product in Formula 2 in the film, the 3-hydroxyflavone with small molecular size cannot be well dispersed in the EVA copolymer. Therefore, the film of EVA copolymer blended with small molecule such as 3-hydroxyflavone would have higher haze, such that the film would not be suitable to be used to encapsulating a solar cell.

TABLE 5

| | Comparative Example 2 |
|---|---|
| EVA weight percentage | 90 |
| 3-hydroxyflavone weight percentage | 10 |
| Transparency (%) | 91.25 |
| Haze (%) | 4 |

Example 3

The Module Encapsulating and the Preparation of the Encapsulation Film for a Solar Cell 90 g of EVA resin colloidal particles and 10 g of the photoluminescent polymer in Formula 2 and in Formula 4 were blended at 80° C. by a single screw mixer (commercially available from Meisei Metal Industries Co., Ltd., Japan) with a lift to drag (L/D) ratio of 20 to form the samples of Example 2c and 2f in Table 6. Subsequently, 50 g of the blended resin was compressed to form an encapsulation film (200 mm*200 mm*0.65 mm). In addition, the EVA encapsulation film (commercially available from Mitsui Co., Japan) and MCLA2D (laboratory prepared) were selected as the comparative encapsulation films, wherein the films had a thickness of 0.6 mm to 1 mm. The MCLA2D was composed of 100 g of EVA (commercially available from Dupont) and 3.95 g of resin accelerators, wherein the resin accelerators included 0.6 g of 2-hydroxy-4-N(octyloxy)benzophenone (commercially available from Acros), 0.6 g of bis(2,2,6,6-tetrabutyl-4-piperidyl)sebacate (commercially available from Acros), 0.8 g of 2,5-dimethyl-2,5-di(tert-butylperoxy)hexane (commercially available from Acros), and 1.95 g of triallyl isocyanurate (commercially available from Acros).

As shown in FIG. 1, the encapsulation film 11 was formed on the substrates 13 and 15. The solar cell module 17 was set between the backpanes 13 and 15, and then charged in a vacuum compression apparatus for thermal compression for completing a solar cell module encapsulating. The device performances of the solar cell module encapsulating with different encapsulation films were measured and tabulated and are shown in Table 6.

TABLE 6

| Encapsulation film | Maximum output (Wp) | Short-circuit Current (A) | Open-circuit voltage (V) |
|---|---|---|---|
| Example 2c | 3.60 | 8.11 | 0.62 |
| Example 2f | 3.64 | 8.97 | 0.61 |
| EVA | 3.55 | 8.01 | 0.62 |
| MCLA2D | 3.57 | 8.00 | 0.62 |

| | Transparency (%) with process temperature 150° C. | Transparency (%) with process temperature 130° C. | Light conversion efficiency (%) | Light conversion efficiency improvement (%) |
|---|---|---|---|---|
| Example 2c | 89.07 | 89.67 | 14.79 | 1.40 |
| Example 2f | 91.60 | 91.68 | 14.99 | 2.80 |
| EVA | 87.75 | 85.78 | 14.58 | None |
| MCLA2D | 88.09 | 88.52 | 14.67 | None |

As shown in Table 6, the photoluminescent polymer blended with EVA not only increased transparency of the encapsulation film, but also improved light conversion efficiency of the solar cell utilizing the encapsulation films.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An encapsulation material, comprising:
   an 80 to 99.5 weight percentage (wt %) of an ethylene vinyl acetate copolymer (EVA); and
   a 0.5 to 20 weight percentage (wt %) of a photoluminescent polymer, wherein the EVA and the photoluminescent polymer are evenly blended;
   wherein the photoluminescent polymer has the general formula as follows:

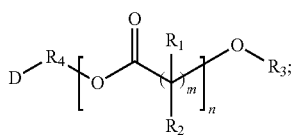

wherein D is a photoluminescent group;
   $R_1$, $R_2$, and $R_3$ are independently selected from hydrogen, a substituted $C_{1-6}$ alkyl group, or an unsubstituted $C_{1-6}$ alkyl group;
   $R_4$ is a substituted $C_{1-6}$ alkylenyl group or an unsaturated $C_{1-6}$ alkylenyl group;
   m is an integer of 1 to 5; and
   n is 10 to 10,000.

2. The encapsulation material as claimed in claim 1, wherein the EVA has a number-average molecular weight (Mn) of 5,000 to 100,000.

3. The encapsulation material as claimed in claim 1, wherein the photoluminescent group of the photoluminescent polymer absorbs UV radiation having a wavelength of less than 400 nm to emit a visible light having a wavelength greater than 400 nm, and wherein the visible light includes a fluorescence or a phosphorescence light.

4. The encapsulation material as claimed in claim 1, wherein the photoluminescent polymer has a number-average molecular weight (Mn) of 5,000 to 100,000.

5. The encapsulation material as claimed in claim 1, wherein the photoluminescent polymer has a refractive index of 1.2 to 1.7.

6. The encapsulation material as claimed in claim 1, wherein the photoluminescent polymer has a melting point of 50° C. to 130° C.

7. The encapsulation material as claimed in claim 1, wherein the photoluminescent group is a pyrenyl group, an anthracenyl group, a naphthalenyl group, a flavonyl group, a coumarinyl group, a perylenyl group, a carbazole group, derivatives thereof, or combinations thereof.

8. The encapsulation material as claimed in claim 1, wherein the ethylene vinyl acetate copolymer is copolymerized from an ethylene monomer and a vinyl acetate monomer, and the ethylene monomer and the vinyl acetate monomer have a molar ratio of 60:40 to 80:20.

9. The encapsulation material as claimed in claim 1, further comprising a 0.1 to 5 weight percentage (wt %) of an additive.

10. The encapsulation material as claimed in claim 9, wherein the additive comprises a resin accelerator, a thermal stabilizer, or combinations thereof.

11. The encapsulation material as claimed in claim 10, wherein the resin accelerator comprises a benzoyl peroxide, a dicummyl peroxide, a 2,5-dimethyl-2,5-di(tert-butylperoxy)hexane, a 1,1-di(tert-butylperoxy)-3,3,5-trimethylcyclohexane, or combinations thereof.

12. The encapsulation material as claimed in claim 10, wherein the thermal stabilizer comprises a butylhydroxytoluene, a bis(2,2,6,6-tetramethyl-4-piperidyl)sebacate, or combinations thereof.

13. A solar cell encapsulating module, comprising:
   an encapsulation material comprising:
      an 80 to 99.5 weight percentage (wt %) of an ethylene vinyl acetate copolymer (EVA); and
      a 0.5 to 20 weight percentage (wt %) of a photoluminescent polymer, wherein the EVA and the photoluminescent polymer are evenly blended;
      wherein the photoluminescent polymer has the general formula as follows:

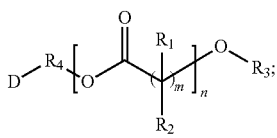

wherein D is a photoluminescent group;
   $R_1$, $R_2$, and $R_3$ are independently selected from hydrogen, a substituted $C_{1-6}$ alkyl group, or an unsubstituted $C_{1-6}$ alkyl group $R_4$ is a substituted $C_{1-6}$ alkylenyl group or an unsaturated $C_{1-6}$ alkylenyl group;

m is an integer of 1 to 5; and n is 10 to 10,000.

14. The solar cell encapsulating module of claim 13, further comprising:
a first substrate having a first layer of the encapsulating material formed on a surface thereof;
a second substrate having a second layer of the encapsulating material formed on a surface thereof, arranged such that the first layer and the second layer are facing each other; and
a solar cell disposed between the first layer and the second layer.

* * * * *